United States Patent [19]

Kornely, Jr.

[11] Patent Number: 5,224,249

[45] Date of Patent: Jul. 6, 1993

[54] CORROSION PREVENTION OF HONEYCOMB CORE PANEL CONSTRUCTION USING ION IMPLANTATION

[75] Inventor: Michael G. Kornely, Jr., Centerport, N.Y.

[73] Assignee: Grumman Aerospace Corporation, Bethpage, N.Y.

[21] Appl. No.: 822,755

[22] Filed: Jan. 21, 1992

[51] Int. Cl.$^5$ .................. B21D 31/04; B29C 73/06
[52] U.S. Cl. .................. 29/6.1; 148/DIG. 84; 156/197; 250/492.3
[58] Field of Search .................. 29/6.1, 17.1, 17.2, 29/17.3; 148/DIG. 82, DIG. 83, DIG. 84; 156/197; 228/157; 250/398, 492.1, 492.3, 492.2

[56] References Cited

U.S. PATENT DOCUMENTS

| | | | |
|---|---|---|---|
| 3,365,787 | 1/1968 | Forsberg et al. | 228/157 |
| 3,915,757 | 10/1975 | Engel | 250/492.1 |
| 4,124,802 | 11/1978 | Terasawa et al. | 250/492.2 |
| 4,693,760 | 9/1987 | Sioshansi | 148/4 |
| 4,894,127 | 1/1990 | Wong et al. | 204/58.5 |
| 4,986,871 | 1/1991 | Leslie | 156/197 X |
| 5,007,225 | 4/1991 | Teasdale | 52/799 |
| 5,024,369 | 6/1991 | Eylon | 228/157 |

*Primary Examiner*—Timothy V. Eley
*Attorney, Agent, or Firm*—Bacon & Thomas

[57] ABSTRACT

A method for increasing the corrosion resistance of honeycomb core panel construction by using an ion implantation process. In one aspect of the invention, molybdenum ions are implanted to a predetermined depth into the front and back surfaces of a honeycomb-shaped core. The ions interact with the metal in the core wall to form an aluminum-molybdenum alloy which is impervious to corrosion. In another aspect of the invention, both front and back surfaces of the honeycomb-shaped core are bombarded with ions so that the ions are implanted throughout the entire core wall. The method may also be extended to include implanting ions into the outer skin layers to achieve enhanced corrosion resistance.

13 Claims, 2 Drawing Sheets

CORROSION PREVENTION OF HONEYCOMB CORE PANEL CONSTRUCTION USING ION IMPLANTATION

FIELD OF THE INVENTION

The present invention relates generally to corrosion prevention of metal alloys, and, more particularly, to a method for preventing corrosion in honeycomb core panel construction which is made from aluminum or one of its alloys.

BACKGROUND OF THE INVENTION

Honeycomb core panel construction which is made from aluminum or one of its alloys is highly susceptible to corrosion caused by atmospheric moisture. Honeycomb core panel construction utilizes two outer "skin" layers that sandwich a honeycomb-shaped core, and is used extensively in the fabrication of fins, wings and other structure in virtually all aircraft, including high-performance tactical aircraft such as the EF-111A and the F-14. Atmospheric moisture often seeps into and becomes trapped between the outer skin layers of the honeycomb core panel construction. Over time, the water seepage corrodes the honeycomb-shaped core, making the aircraft structurally unsound and, therefore, unsafe for flight. The eventual result is that the entire aircraft control surface made from the deteriorated honeycomb core panel construction must be either rebuilt or replaced at a great cost.

The formation of protective coatings on metal sheets for increasing corrosion resistance is known. For example, U.S. Pat. No. 4,894,127 disclosed an anodizing process which is used to form a 1 to 3 micro thick coating of aluminum oxide onto the surface of an aluminum plate. Another process for increasing corrosion resistance involves cladding films of pure aluminum 0.002–0.005 inches thick onto the surface of sheet metal. Still another technique for increasing corrosion resistance, which is disclosed in U.S. Pat. No. 5,007,225, involves the application of paints, foams and other anti-corrosion materials to the inner and outer surfaces of metal sandwich panel structures, which are used primarily in the fabrication of ship hulls and bulkheads.

The use of surface coatings to increase the corrosion resistance of honeycomb core panel construction is undesirable for two reasons. First, the honeycomb-shaped core is left vulnerable to corrosion in those areas where the surface coatings fail to cover. Corrosion in these exposed areas eventually causes the deterioration of the entire panel, which results in the repair or replacement of the aircraft control surface at a significant cost. Second, surface coatings applied to the honeycomb-shaped core will cause a substantial increase in the weight of an aircraft, which compromises aircraft flight efficiency and performance.

An alternative corrosion prevention technique, implantation of ions into the surface of a metal, has been used for increasing wear and corrosion resistance in metals in contexts unrelated to honeycomb core panel construction. For example, U.S. Pat. No. 4,743,308 discloses a method wherein ion implantation is used to change the surface characteristics of titanium parts which are used in the construction of human body joint implants. The penetration of ions into the titanium surface creates an alloy which improves the wear and corrosion resistance of the metal without the drawbacks associated with the use of protective coatings. U.S. Pat. No. 4,693,760 specifically discloses implanting molybdenum ions into the surface of a metal workpiece. Although extensively used in the above-stated applications, however, no known ion implantation process exists for increasing the corrosion resistance of honeycomb core panel construction.

The lack of an effective technique for preventing the corrosion of aluminum honeycomb core panel construction has led aircraft designers to substitute heavier, less-corrosive metals or alternative standard construction techniques. Heavier substitute metals substantially increase aircraft manufacturing costs and significantly compromise aircraft flight efficiency and performance. Even the lighter substitute metals, such as titanium, produce undesirable effects in the form of increased aircraft weight and cost. Non-corrosive, non-metallic materials may be substituted. However, such materials are also undesirable because, in addition to increasing cost, they possess a low strength-to-weight ratio.

Because aluminum has the best weight-to-strength ratio of commonly used metal, it is imperative to retain the ability to use aluminum honeycomb core panel construction in the design of aircraft control surfaces. Therefore, a need exists to provide an effective method for increasing the corrosion resistance of aluminum honeycomb core panel construction.

SUMMARY OF THE INVENTION

Accordingly, it is a principal objective of the present invention to provide an improved method for increasing the wear, corrosion, and scratch resistance of honeycomb core panel construction, by using ion implantation to alter the surface characteristics of a honeycomb-shaped core and skin so that it is impervious to atmospheric corrosion.

It is a further objective of the present invention to provide an improved method for increasing the corrosion resistance in honeycomb core panel construction by using an ion implantation process wherein the degree of corrosion resistance may be varied by adjusting the depth of ion implantation into the wall of the honeycomb-shaped core.

It is a further objective of the present invention to provide a improved method for increasing the corrosion resistance of honeycomb core panel construction whose effects are longer-wearing than existing corrosion resistance techniques.

It is a further objective of the present invention to provide a method for increasing the corrosion resistance of honeycomb core panel construction that improves flight safety by reducing the chances of a catastrophic failure of an aircraft control surface caused by internal corrosion.

It is a further objective of the present invention to provide an improved method for increasing the corrosion resistance of honeycomb core panel construction which, over time, will achieve the benefit of a substantial reduction in life cycle material costs by eliminating the need for rebuilding or replacing vital aircraft control surfaces.

It is a further objective of the present invention to provide a method for implanting ions into aluminum and its alloys.

The foregoing and other objectives of the invention are achieved by providing an improved method for increasing the corrosion resistance of honeycomb core panel construction by using an ion implantation process.

In one aspect of the invention, molybdenum ions are implanted through the entire core thickness of a honeycomb-shaped core. The core metal and molybdenum ions interact to form an aluminum-molybdenum alloy which is impervious to corrosion. The corrosion resistant core is then fixedly attached between two outer skin layers to form the finished honeycomb core panel construction. In another aspect of the invention, both the front and back surfaces of the honeycomb-shaped core are bombarded with ions to achieve ion implantation to a predetermined depth of the core wall. The ion implantation method of the present invention may be extended to include implanting ions in the two outer skin layers to achieve enhanced corrosion resistance. Thus the process of the present invention produces a honeycomb core panel construction which achieves greater resistance to corrosion from atmospheric moisture without realizing the weight gain generated by conventional corrosion prevention techniques. In addition, by thoroughly coating the entire surface area of the core, the ion implantation method of the present invention is more effective in preventing corrosion over existing techniques, which in practice often leave areas on the core surface untreated and, therefore, vulnerable to corrosion.

BRIEF DESCRIPTION OF THE DRAWINGS

The preferred embodiments are described with reference to the drawings in which.

DESCRIPTION OF THE PREFERRED EMBODIMENTS

Figure 1:
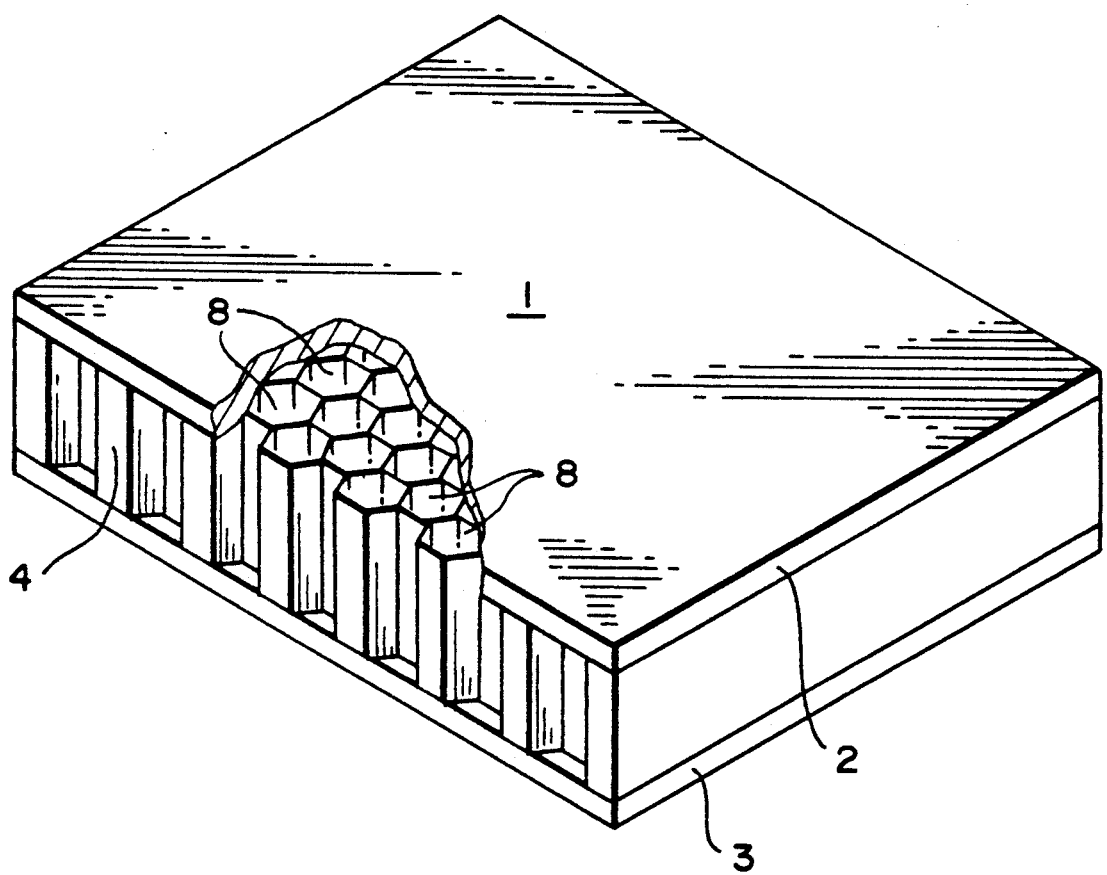
FIG. 1 is a schematic view of the core and outer skin layers of a honeycomb core panel construction which is treated to become resistant to corrosion using the method in accordance with the present invention.

The process of the present invention, in general, pertains to increasing the corrosion resistance of honeycomb core panel construction by implanting ions of a preselected material into the honeycomb-shaped core. FIG. 1 shows a typical honeycomb core panel construction 1 comprising outer skin layers 2 and 3 and a honeycomb-shaped core 4. Honeycomb-shaped core 4 is very thin, typically 0.001 to 0.003 inches thick, and advantageously is constructed of a plurality of interconnected hexagonal cells 8 which are designed to enhance the structural strength of the panel construction.

Implantation of ions into a metal workpiece is achieved using, for example, a mass-analyzed ion implanter. A mass-analyzed ion implanter generates an ion beam by using a conventional chlorination technique. The chlorination technique involves introducing chlorine gas into an ion source chamber which contains a sample of a predetermined material. The chlorine gas reacts with the sample material to form a compound, which is heated until it becomes volatile and emits positive ions. The positive ions in the ion source are extracted from a slit in the ion chamber and are directed into an ion accelerator. The ion accelerator accelerates the positive ions to form an ion stream. An electromagnet located at the output of the ion accelerator selectively filters out all but the ions of the preselected material to form an isotopically pure ion beam. During an implantation procedure, the ion implanter focuses the ion beam towards the surface of a metal workpiece, which is positioned on a platform located under the output of the ion implanter. Ions penetrate into the surface of a metal workpiece a predetermined depth proportional to the degree of acceleration of the ion beam. The above-described ion implanter is of the type disclosed in U.S. Pat. No. 4,693,760.

Figure 2:
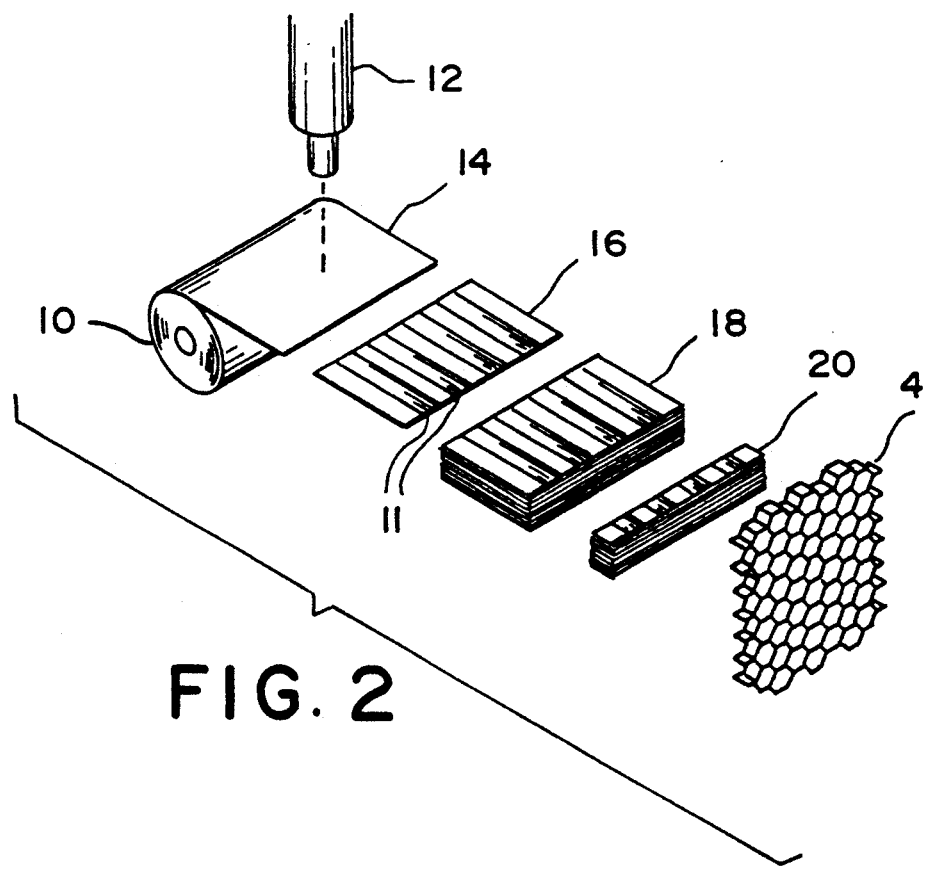
FIG. 2 is a diagram showing the steps taken within in the expansion phase included in the process of the present invention.
Figure 3:
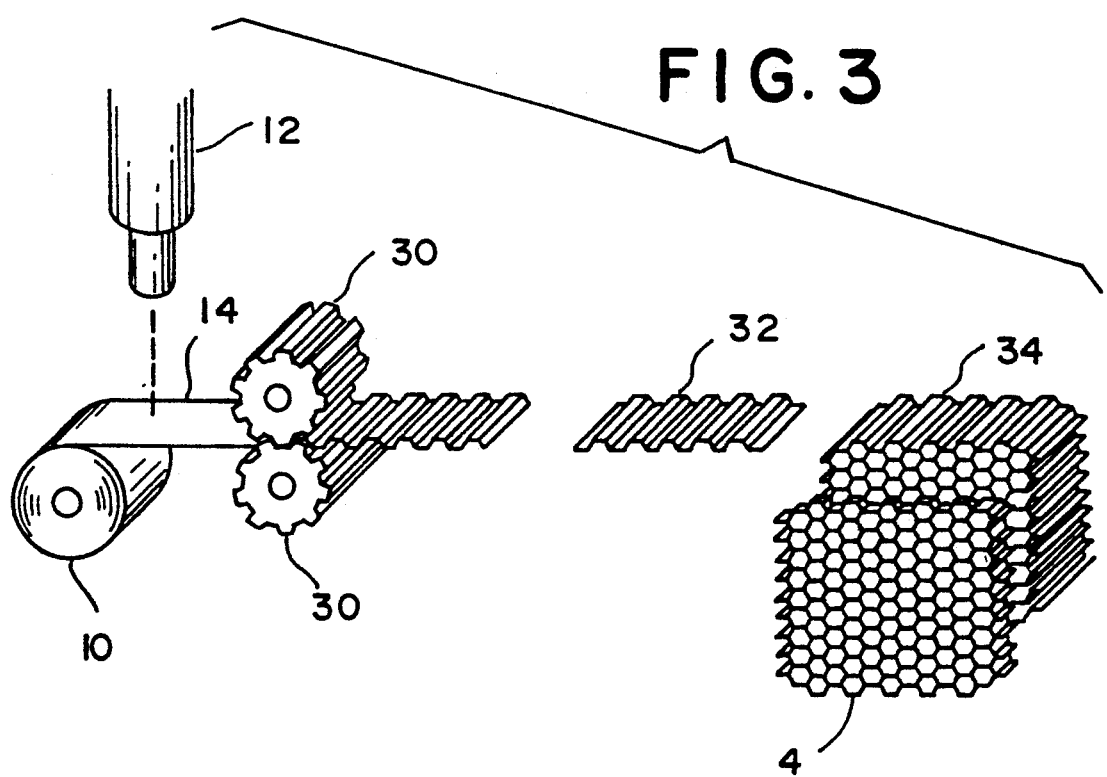
FIG. 3 is a diagram showing the steps taken within the corrugation phase included in the process of the present invention.

The corrosion prevention process of the present invention is a multi-staged process which commences during the initial manufacturing steps of the honeycomb-shaped core. The first stage of the process involves implanting ions of a preselected material into the honeycomb-shaped core metal while it is still in raw sheet metal form. As depicted in FIGS. 2 and 3, core metal 10 in web or roll form is fed under an ion implanter 12 at a uniform rate. Ion implanter 12 accelerates ions of a preselected material to a high energy level, typically to several hundred kiloelectron volts, to form a high-speed metallic ion stream 14. Ions within the metallic ion stream strike the surface of core metal 10 and penetrate therein to a predetermined thickness. The implanted ions mix with the atoms of the core metal to advantageously form an alloy which is impervious to corrosion from atmospheric moisture. The implanted metallic ions are so small that they can successfully treat the entire surface area of the thin core wall.

The second stage of the process involves either an expansion or corrugation phase during which the ion implanted core metal is worked into a honeycomb-shaped form. During an expansion phase, as depicted in FIG. 2, the ion implanted core metal 10, while still in web form, is fed into a series of high-precision machines (not shown) which treat the surface of core metal 10 with continuous ribbons of structural adhesives 11. The now treated and ion-implanted core metal 10, shown at 16 in FIG. 2, is cut to desired dimensions and then stacked layer upon layer to form a metal block 18 having a desired thickness. This metal block is commercially known as a HOBE (honeycomb before expansion) block. Horizontal slices of predetermined thickness are sawed from metal block 18 to form a HOBE slice 20. HOBE slice 20 is then expanded using conventional techniques to form the familiar honeycomb-shaped core 4.

During a corrugation phase, as depicted in FIG. 3, the ion-implanted core metal 10 in web form is cut to a desired width and fed into the nip of a pair of corrugated rolls 30. Corrugated rolls 30 deform the core metal 10 to form a corrugated sheet 32. Corrugated sheet 32 is then cut from the roll and its surface is treated with structural adhesives (not shown). A plurality of corrugated sheets are then stacked one on top of the other to form a rigid corrugated block 34. The adhesives on each corrugated sheet 32 bind to each adjacent sheet to form a rigid, honeycomb-shaped cross-section. Slices of predetermined width are sawed off of block 34 to form a corrugated panel which constitutes a honeycomb-shaped core 4.

The above-described ion implantation process may produce changes in the material characteristics, e.g., the hardness, of core metal 10 which, in turn, may adversely affect the ability of corrugated rolls 30 to deform core metal 10 into the desired cell geometry. To ensure proper deformation of the core metal during the corrugation phase, the ion implantation process may therefore alternatively be performed at some point after the corrugation of core metal 10. For instance, the ion implanter 12 may be located at a position after corrugated rolls 30 (not shown) for implanting ions into the surface of corrugated sheet 32.

The third stage of the process entails forming the outer skin layers 2 and 3 of the honeycomb core panel construction so that their dimensions match the dimensions of the honeycomb-shaped core developed in the second stage. The formation of outer skin layers 2 and 3 is achieved by using conventional techniques.

The final stages of the process involve sanding, drilling and fitting the unrefined edges of outer skin layers 2 and 3 and honeycomb-shaped core 4. Outer skin layers 2 and 3 are then fixedly attached to either side of a honeycomb-shaped core 4, preferably by using an adhesive bonding process, to form a finished honeycomb core panel construction with enhanced corrosion resistance characteristics.

In the best mode and as a first aspect of the invention, honeycomb-shaped core 4 is made of aluminum or one of its alloys and the implanted ions are made of molybdenum. The ion implanter directs accelerated molybdenum ions onto the front surface of the core metal. The molybdenum ions penetrate through the front surface of the core metal and are implanted a predetermined depth into the core wall. The ions modify the surface characteristics of the aluminum core to form an aluminum-molybdenum alloy which is impervious to corrosion. By increasing the acceleration of the ions in the ion implanter, the penetration of molybdenum ions into the core wall can be adjusted to achieve a minimum depth of angstroms to a maximum depth of the entire thickness of the core wall. Ions are implanted throughout the entire thickness of the core wall to achieve the most effective resistance to corrosion over long periods of time.

In a second aspect of the method of the present invention, both the front and back surfaces of the honeycomb core are bombarded with ions of a preselected material to ensure that ion implantation occurs throughout the entire thickness of the core wall.

In a third aspect of the method of the present invention, the surfaces of outer skin layers 2 and 3 are implanted with ions in a manner identical to the ion-implantation process used on the honeycomb-shaped core 4. Ion-implanted, outer skin layers 2 and 3 advantageously provide enhanced corrosion prevention protection by serving as an exterior barrier that prevents atmospheric moisture from seeping into the underlying honeycomb-shaped core.

The process of the present invention may be used to increase the corrosion resistance of other structures made from aluminum and aluminum alloy sheet and plate, such as shelves, bulkheads and floors, as well as other metals. In addition, the process may be used to protect areas which have been made sensitive to corrosion during their fabrication process, such as countersinking and counterboring for screw holes.

Other modifications and variations to the invention will be apparent to those skilled in the art from the foregoing disclosure. Thus, while only certain embodiments of the invention have been specifically described herein, it will be apparent that numerous modifications may be made thereto without departing from the spirit and scope of the invention.

What is claimed is:

1. A process for preventing corrosion caused by atmospheric moisture in honeycomb core panel construction, said construction having two outer skin layers bonded to opposite sides of a honeycomb-shaped core, said process comprising the steps of:
   providing a core metal for a honeycomb-shaped core which is fabricated from aluminum or one of its alloys;
   immersing the core metal in an ion stream so that the core metal is bombarded with ions of a predetermined material, said ions penetrating through at least one surface of the core metal and being implanted a predetermined depth therein so that an alloy is formed between said core metal and said material which is impervious to corrosion; and
   deforming said core metal into a honeycomb-shaped structure so as to form the honeycomb-shaped core having front and back surfaces.

2. The process as specified in claim 1, wherein said core metal is deformed by using either a corrugation process or an expansion process.

3. The process as specified in claim 1, wherein said honeycomb core is bombarded by ions on both its front and back surfaces, said bombardment penetrating into the core surfaces to a predetermined depth, said predetermined depth adjustable in the range extending from angstroms to the entire thickness of the core.

4. The process as specified in claim 1, further comprising the step of immersing two outer skin layers in an ion stream so that ions of said predetermined material penetrate into at least one surface of said skin layers and being implanted therein to a predetermined depth.

5. The process of claim 4, wherein said predetermined depth extends from a few angstroms to the entire thickness of the skin layer.

6. The process of claim 5, further comprising the step of bonding the skin layers to opposite sides of the honeycomb-shaped core.

7. The process as specified in claim 1, wherein said material is molybdenum.

8. The process as specified in claim 1, wherein said predetermined depth extends from a few angstroms to the entire thickness of the core metal.

9. A process for preventing corrosion caused by atmospheric moisture in honeycomb core panel construction, said process comprising the steps of:
   providing a core metal for a honeycomb-shaped core which is fabricated from a predetermined metal;
   immersing the core metal in an ion stream so that the core metal is bombarded with ions of a predetermined material on at least one surface, said ions penetrating into said at least one surface of the core metal and being implanted therein throughout the entire thickness of the core metal so that an alloy is formed between said core metal and said material which is impervious to corrosion; and
   deforming said core metal into a honeycomb-shaped structure so as to form the honeycomb-shaped core having front and back surfaces.

10. The process as specified in claim 9, wherein said core metal is bombarded by ions on both its front and back surfaces.

11. The process as specified in claim 9, wherein said core metal and said predetermined metal are aluminum or one of its alloys.

12. The process as specified in claim 9, wherein said core metal is deformed by using either a corrugation process or an expansion process.

13. The process as specified in claim 9, wherein the predetermined material is molybdenum.

* * * * *